(12) United States Patent
LiCausi et al.

(10) Patent No.: US 8,846,511 B2
(45) Date of Patent: Sep. 30, 2014

(54) METHODS OF TRIMMING NANOWIRE STRUCTURES

(71) Applicant: GLOBALFOUNDRIES Inc., Grand Cayman (KY)

(72) Inventors: Nicholas V. LiCausi, Watervliet, NY (US); Jeremy A. Wahl, Delmar, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 72 days.

(21) Appl. No.: 13/764,839

(22) Filed: Feb. 12, 2013

(65) Prior Publication Data

US 2014/0227849 A1    Aug. 14, 2014

(51) Int. Cl.
*H01L 21/00*    (2006.01)
*H01L 29/66*    (2006.01)

(52) U.S. Cl.
CPC ............... *H01L 29/66477* (2013.01)
USPC .......................... 438/558; 438/719

(58) Field of Classification Search
USPC .................. 438/558–564, 719
See application file for complete search history.

(56) References Cited

U.S. PATENT DOCUMENTS 6,897,098 B2 *  5/2005  Hareland et al. .............. 438/128

* cited by examiner

*Primary Examiner* — Richard Booth
(74) *Attorney, Agent, or Firm* — Amerson Law Firm, PLLC

(57) ABSTRACT

One illustrative method disclosed herein includes forming an initial nanowire structure having an initial cross-sectional size, performing a doping diffusion process to form an N-type doped region in the initial nanowire structure and performing an etching process to remove at least a portion of the doped region and thereby define a final nanowire structure having a final cross-sectional size, wherein the final cross-sectional size is smaller than the initial cross-sectional size.

29 Claims, 4 Drawing Sheets

METHODS OF TRIMMING NANOWIRE STRUCTURES

BACKGROUND OF THE INVENTION

1. Field of the Invention

Generally, the present disclosure relates to the manufacture of sophisticated integrated circuit products, and, more specifically, to various methods of trimming nanowire structures employed in various semiconductor devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, there are so-called 3D devices, such as an illustrative FinFET device, which is a three-dimensional structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive current than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond. A further improvement upon FinFET devices involves the use of a dielectric isolation material to completely isolate the "fin" channel from one another and the substrate. The isolation material tends to reduce leakage between neighboring FinFET devices as well as decrease leakage current between the source and drain that travels through the substrate in a typical "bulk" FinFET device.

Another form of 3D semiconductor device employs so-called nanowire structures for the channel region of the device. There are several known techniques for forming such nanowire structures. FIGS. 1A-1C are various views of an illustrative 3D device 10 at the point of fabrication wherein the basic nanowire structures 14 have been formed. FIG. 1A is a plan view of the device 10, and FIGS. 1B-1C are cross-sectional views of the device 10 taken where indicated in FIG. 1A.

As shown in FIGS. 1A-1C, the 3D device 10 includes three illustrative nanowire structures 14 that are formed above a semiconductor substrate 12. The ends of the nanowire structures 14 are anchored to portions 16 of the substrate (shown in dashed lines in FIG. 1C). In some cases, the nanowire structures 14 may be formed prior to the formation of a trench isolation region around the device 10. As shown in FIG. 1C, in one embodiment, the nanowire structures 14 may have a generally circular cross-sectional configuration.

In general, as semiconductor devices are scaled to smaller and smaller feature sizes, it is becoming even more important that manufacturing techniques used to make the device have the capability to reliably and repeatedly produce features that have a uniform size and configuration. This is also true for advanced semiconductor devices that employ nanowire structures as the channel region for the device. As with previous types of transistor devices, there is a constant demand to produce very small nanowire structures.

The present disclosure is directed to various methods of trimming nanowire structures employed in various semiconductor devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of trimming nanowire structures employed in various semiconductor devices. One illustrative method disclosed herein includes forming an initial nanowire structure having an initial cross-sectional size, performing a doping diffusion process to form an N-type doped region in the initial nanowire structure and performing an etching process to remove at least a portion of the doped region and thereby define a final nanowire structure having a final cross-sectional size, wherein the final cross-sectional size is smaller than the initial cross-sectional size.

Another illustrative method disclosed herein includes forming an initial nanowire structure having an initial cross-sectional size, performing a doping diffusion process to form an N-type doped region in the initial nanowire structure, wherein the doping diffusion process is performed at a temperature that falls within the range of about 600-1100° C. and wherein the doped region has a dopant concentration of N-type dopant material that falls within the range of about $10^{19}$-$10^{21}$ atoms/cm$^3$, and performing an etching process to remove at least a portion of the doped region and thereby define a final nanowire structure having a final cross-sectional size, wherein the final cross-sectional size is smaller than the initial cross-sectional size.

BRIEF DESCRIPTION OF THE DRAWINGS

The disclosure may be understood by reference to the following description taken in conjunction with the accompanying drawings, in which like reference numerals identify like elements, and in which.

Figure 1A:
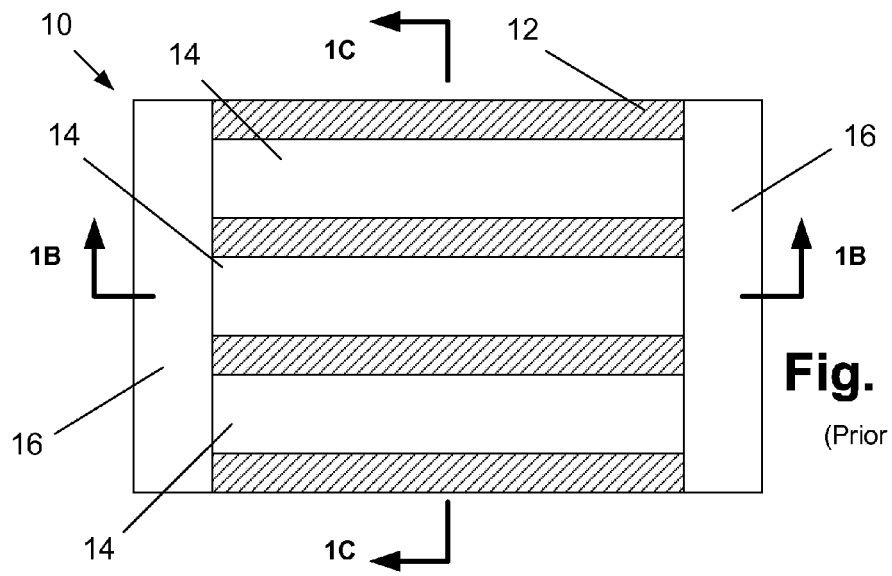
FIGS. 1A-1C depict an illustrative prior art 3D device that employs nanowire structures.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of trimming nanowire structures employed in various semiconductor devices. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

Figure 1B:
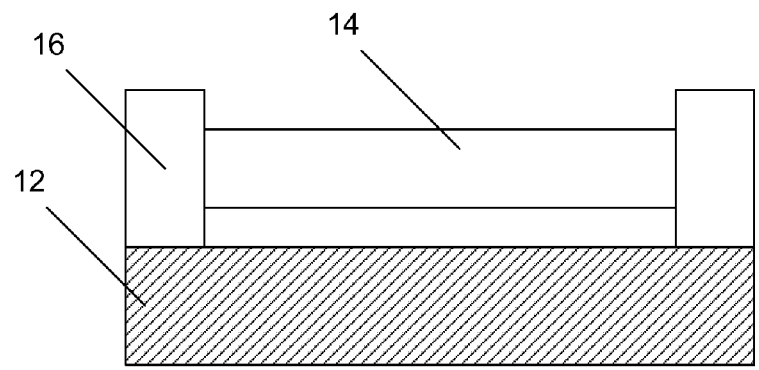
Figure 1C:
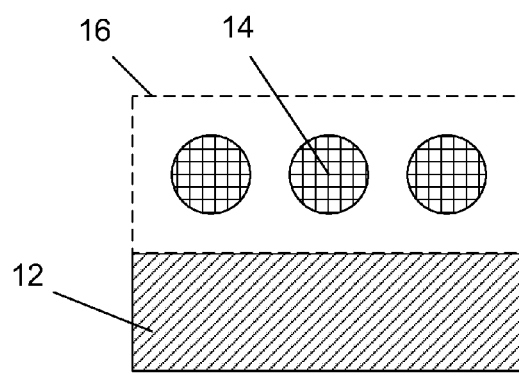
Figure 2A:
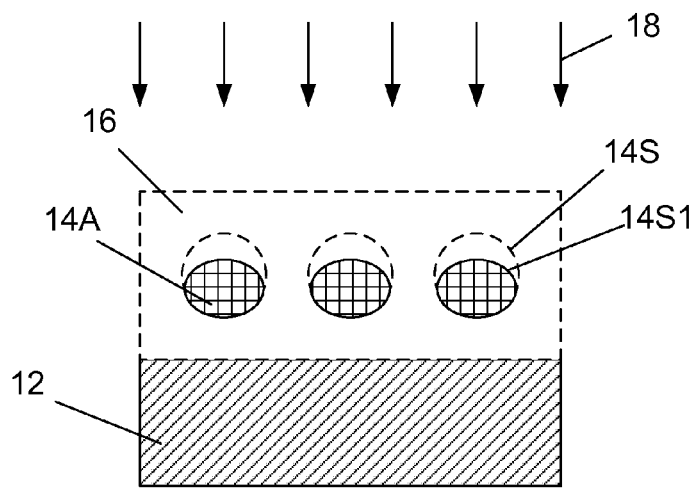
FIGS. 2A-2F are provided to explain various novel methods disclosed herein for trimming nanowire structures employed in various semiconductor devices.
Figure 2B:
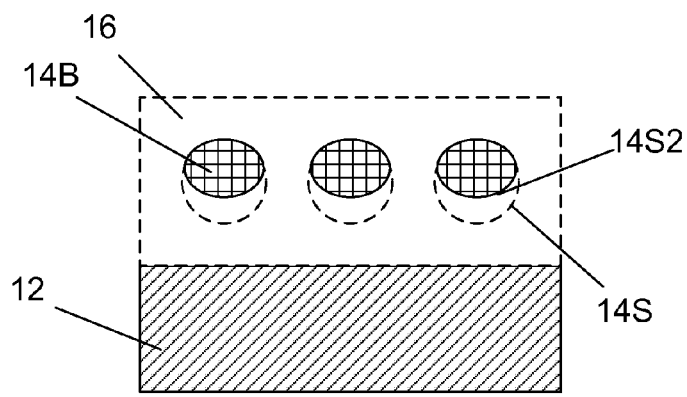

In terms of possible techniques for reducing the size of the illustrative nanowire structure 14 shown in FIGS. 1A-1C, the use of dry or wet etching techniques might be performed on the nanowire structures. FIG. 2A depicts a hypothetical situation where a direction reactive ion etching (RIE) process 18 may be performed in an attempt to reduce the size of the original nanowire structures 14. As can be seen in FIG. 2A, due to the directional nature of the RIE etch process 18, the removal of the material of the nanowire structures 14 was not uniform around the circumference of the nanowire structures 14. Compare the cross-sectional configuration 14S of the original nanowire structures 14 (shown in dashed lines) with cross-sectional configuration 14S1 of the post RIE-etched nanowire structures 14A. FIG. 2B depicts another hypothetical possibility where a wet etching process may be performed in an attempt to reduce the size of the original nanowire structures 14. Unfortunately, such a wet etching process may also result in non-uniform material removal around the perimeter of the nanowire structures 14. For example, given the configuration of the device 10, the etchant materials may effectively spend more time between the nanowire structures 14 and the substrate 12, thereby leading to more etching of the underside of the nanowire structures 14. Compare the cross-sectional configuration 14S of the original nanowire structures 14 with cross-sectional configuration 14S2 of the post wet-etch nanowire structures 14B. Thus, it appears that performing traditional dry or wet etching processes alone would not be good candidates for reducing the size of nanowire structures.

FIGS. 2C-2F are cross-sectional views of an illustrative embodiment of a novel 3D semiconductor device 100 disclosed herein that employs nanowire structures. The cross-sectional views in FIGS. 2C-2F are taken at the same relative location as the view shown in FIG. 1C. The device 100 may be either an N-type device or a P-type device, and its gate structure may be formed using either so-called "gate-first" or "replacement gate" ("gate-last") techniques. In the attached drawings, the device 100 is depicted as being formed above a semiconductor substrate 102 comprised of a semiconductor material, such as, for example, silicon. The illustrative substrate 102 may be a bulk semiconductor substrate or it make take other forms, such as a so-called silicon-on-insulator (SOI) configuration wherein the semiconductor devices are formed in an active layer positioned above a buried insulation layer (BOX). Thus, the terms "substrate," "semiconductor substrate" or "semiconducting substrate" should be understood to cover all semiconductor materials and all forms of such semiconductor materials. A trench isolation structure (not shown) may be formed in the substrate 102 to define an active region where the device 100 will be formed. Of course, as will be recognized by those skilled in the art after a complete reading of the present application, the isolation structure may be formed before or after the nanowire structures are formed for the device 100.

Figure 2C:
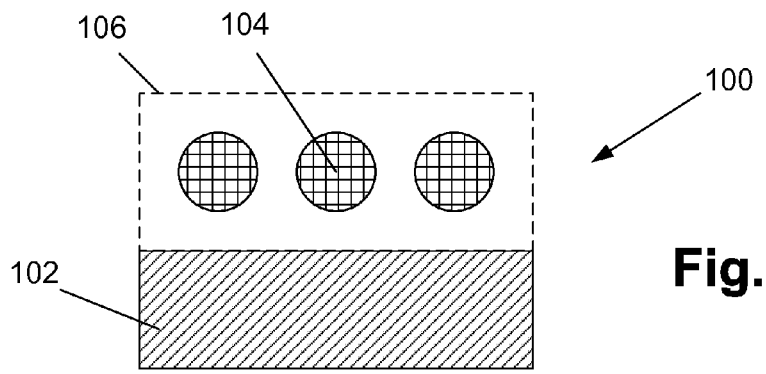

At the point of fabrication depicted in FIG. 2C, a plurality of original or initial nanowire structures 104 have been formed for the device 100. The initial nanowire structures 104 may be formed using any technique. The ends of the initial nanowire structures 104 are anchored to portions 106 of the substrate (shown in dashed lines in FIGS. 2C-2E), which may be similar to the anchor structures 16 shown in FIGS. 1A-1C. In some cases, the initial nanowire structures 104 may be formed prior to the formation of a trench isolation region around the device 100. As shown in FIG. 2C, in one embodiment, the initial nanowire structures 104 may have a generally circular cross-sectional configuration, although other cross-sectional configurations are possible.

Figure 2D:
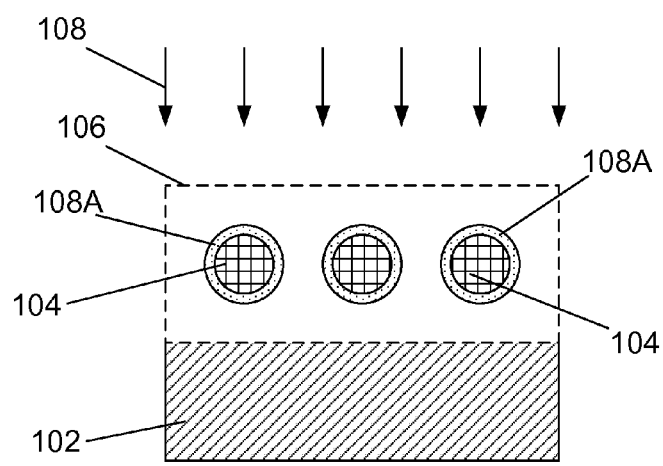

Next, as shown in FIG. 2D, a doping diffusion process 108, such as a plasma doping process or a gas phase doping process, is performed to form doped regions 108A in initial nanowire structures 104. Depending upon the particular application, the doping diffusion process 108 may be performed at a temperature that falls within the range of about 600-1100° C., and it may be performed in a traditional furnace or in a rapid thermal anneal (RTA) chamber. In one particular example, the doping diffusion process 108 may be followed by performing an additional drive-in heat treatment process, although such a dopant drive-in heat treatment process may not be required in all applications. In one illustrative example, the dopant drive-in heat treatment process may be a rapid thermal anneal (RTA) process performed at a temperature that falls within the range of about 600-1100° C. for a duration that falls within the range of about 0.25 milliseconds to 30 seconds. In general, the doping diffusion process 108 will be performed with an N-type dopant material, such as phosphorous, arsenic, antimony, etc., and the doped regions 108A will have a dopant concentration of N-type dopant material that falls within the range of about $10^{19}$-$10^{21}$ atoms/$cm^3$. In one particular example, the doping diffusion process 108 may be a plasma doping process wherein phosphine is combined with a carrier gas and the doped regions 108A have a dopant concentration of about $10^{19}$-$10^{21}$ atoms/$cm^3$. The thickness of the doped regions 108A may vary depending upon the particular application and it may be controlled by controlling the duration and/or temperature of the doping diffusion process 108 and/or the duration and temperature of the subsequent drive-in heat treatment process. In one illustrative embodiment, the thickness of the doped regions 108A may be equal to about 20-80% of the diameter of the initial nanowire structures 104. In general, the doped regions 108A contain a relatively higher concentration of N-type dopant materials than do the adjacent portions of the initial nanowire structures 104, which may, in some cases, be undoped, doped with a P-type dopant or a lesser concentration of N-type dopant material.

Figure 2E:
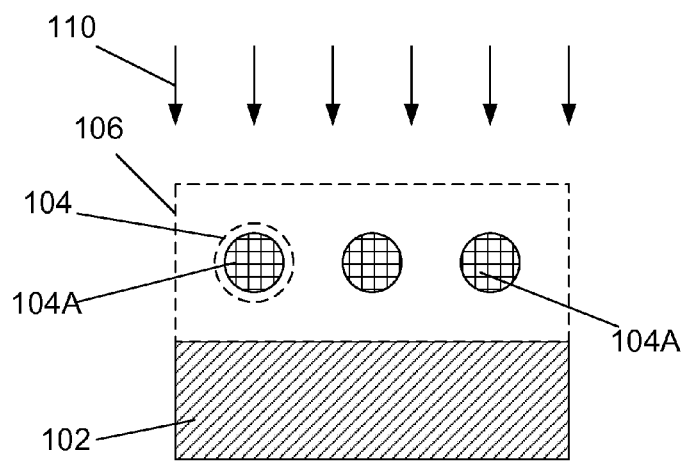

FIG. 2E depicts the device 100 after an etching process 110, such as a wet or dry etching process, is performed to selectively remove the doped regions 108A relative to the surrounding structures. Due to the presence of the dopant material, the doped regions 108A will etch at a faster rate than the portions of the initial nanowire structures 104 that are not part of the doped regions 108A. The etching process 110 effectively defines final nanowire structures 104A for the device 100. As can be seen in FIG. 2E, the methods disclosed herein provide an effective, efficient and controllable means to reduce the overall size of the initial nanowire structures 104, the outer perimeter of which is reflected by the dashed line in FIG. 2E, to the smaller final nanowire structures 104A. In one illustrative example, the etching process 110 may be a dry, chlorine-based etching process. Due to the presence of the doped regions 108A, the etching process 110 is essentially self-limiting in nature, as the difference in etch rates between the doped regions 108A and the portions of the initial nanowire structures 104 that are not part of the doped regions 108A, e.g., depending upon the dopant levels, on the order of about 3:1-300:1. The differences in the etch rates depend upon a variety of factors, e.g., the relative concentrations of dopant material in the doped regions 108A and the remaining portions of the initial nanowire structures 104, the dopant concentration in the surrounding materials and the materials used to construct the device 100. More specifically, using the methods disclosed herein the initial nanowire structure 104 has an initial cross-sectional size while the final nanowire structure 104A has a final cross-sectional size that is smaller than the initial cross-sectional size of the initial nanowire structure 104, e.g., the final cross-sectional size may be about 20-80% smaller than the initial cross-sectional size. However, the initial nanowire structure 104 and final nanowire structure 104A have cross-sectional configurations that are substantially the same even though the final nanowire structure 104A is smaller in overall size, i.e., both 104 and 104A have substantially circular cross-sectional configurations in the example depicted herein. This is due, at least in part, to the uniform nature of the doping diffusion process 108, i.e., the doped region 108A forms in a substantially uniform pattern and depth around the initial nanowire structure 104. Thus, when all or a portion of the doped region 108 is removed during the etching process 110, the final nanowire structure 104A maintains the same approximate cross-sectional configuration of the initial nanowire structure 104.

Figure 2F:
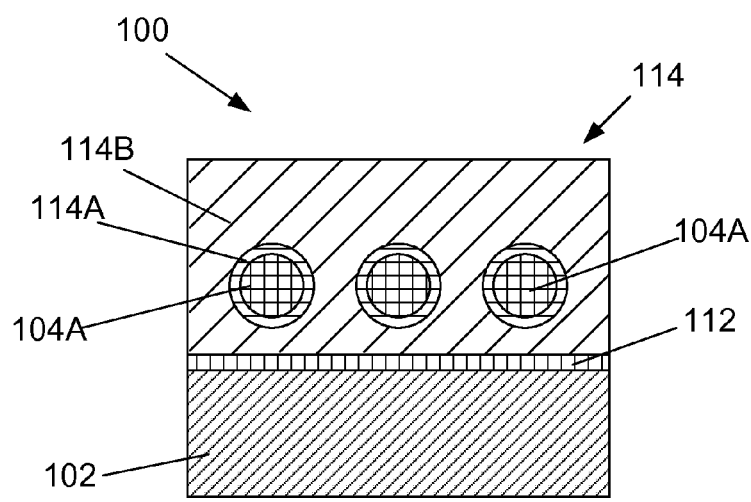

At the point of fabrication depicted in FIG. 2E, traditional manufacturing operations may be performed to complete the manufacture of the device 100. For example, FIG. 2F depicts the device 100 after a layer of insulating material 112 and an illustrative final gate structure 114 was formed on the device 100. The layer of insulating material 112 will serve as isolation material on the final device 100. The layer of insulating material 112 may be comprised of a variety of different materials, such as, for example, silicon dioxide, a low-k insulating material (k value less than about 3.3), SiCOH, etc. or multiple layers thereof, etc., and it may be formed by performing a variety of techniques, e.g., chemical vapor deposition (CVD), etc. The layer of insulating material 112 depicted in FIG. 2F may be formed by initially depositing a layer of the insulating material 112 so as to overfill the trench where the final nanowire structures 104A are located, performing a chemical mechanical polishing (CMP) process to planarize the upper surface of the layer of insulating material 112 using the upper surface of the substrate 102 as a polish-stop, and thereafter performing an etch-back recess process on the layer of insulating material 112 to reduce its thickness to a desired final thickness as depicted in FIG. 2F.

The final gate structure 114 may be formed on the device 100 using any of a variety of well-known techniques. The device 100 may be either an N-type device or a P-type device, and the gate structure 114 for the device 100 may be formed using either so-called "gate-first" or "replacement gate" ("gate-last") techniques. In one illustrative embodiment, the schematically depicted gate structure 114 includes an illustrative gate insulation layer 114A and an illustrative gate electrode 114B. An illustrative gate cap layer (not shown)

may also be formed above the illustrative gate electrode 114B. The gate insulation layer 114A may be comprised of a variety of different materials, such as, for example, silicon dioxide, a so-called high-k (k greater than 7) insulation material (where k is the relative dielectric constant), etc. The thickness of the gate insulation layer 114A may also vary depending upon the particular application, e.g., it may have a thickness of about 0.5-4 nm. Similarly, the gate electrode 114B may also be comprised of a variety of conductive materials, such as polysilicon or amorphous silicon, or it may be comprised of one or more metal layers that act as the gate electrode 114B. As will be recognized by those skilled in the art after a complete reading of the present application, the gate structure 114 of the device 100 depicted in the drawings, i.e., the gate insulation layer 114A and the gate electrode 114B, is intended to be representative in nature. That is, the gate structure 114 may be comprised of a variety of different materials and it may have a variety of configurations. In one illustrative embodiment, a thermal oxidation process may be performed to form a gate insulation layer 114A comprised of a silicon dioxide. Thereafter, the gate electrode material 114B and the gate cap layer material (not shown) may be deposited above the device 100 and the layers may be patterned using known photolithographic and etching techniques. In another illustrative embodiment, a conformal CVD or atomic layer deposition (ALD) process may be performed to form a gate insulation layer 114A comprised of hafnium oxide. Thereafter, one or more metal layers (that will become the gate electrode 114B) and a gate cap layer material (not shown), e.g., silicon nitride, may be deposited above the device 100.

At this point, traditional manufacturing techniques may be performed to complete the manufacture of the device 100. For example, a sidewall spacer (not shown) comprised of, for example, silicon nitride, may be formed adjacent the final gate structure 114. After the spacer is formed, if desired, an epitaxial growth process may be performed to form additional semiconducting material (not shown) on the portions of the final nanowire structures 104A positioned outside of the spacer. Additional contacts and metallization layers may then be formed above the device 100 using traditional techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a device, comprising:
    forming an initial nanowire structure having an initial cross-sectional size;
    performing a doping diffusion process to form an N-type doped region in said initial nanowire structure; and
    performing an etching process to remove at least a portion of said doped region and thereby define a final nanowire structure having a final cross-sectional size, wherein said final cross-sectional size is smaller than said initial cross-sectional size.

2. The method of claim 1, further comprising forming a gate structure around at least a portion of said final nanowire structure.

3. The method of claim 2, wherein said gate structure comprises a gate insulation layer comprised of a high-k insulating material and a gate electrode comprised of at least one layer of metal.

4. The method of claim 2, wherein said gate structure comprises a gate insulation layer comprised of an oxide and a gate electrode comprised of polysilicon.

5. The method of claim 1, wherein performing said doping diffusion process comprises performing one of a plasma doping process or a gas phase doping process.

6. The method of claim 1, wherein said doping diffusion process is performed at a temperature that falls within the range of about 600-1100° C.

7. The method of claim 1, wherein said doped region has a dopant concentration of N-type dopant material that falls within the range of about $10^{19}$-$10^{21}$ atoms/cm$^3$.

8. The method of claim 1, further comprising, after performing said doping process, performing a dopant drive-in heat treatment process.

9. The method of claim 1, wherein performing said etching process comprises performing a chlorine-based etching process.

10. The method of claim 1, wherein said final cross-sectional size is about 20-80% smaller than said initial cross-sectional size.

11. The method of claim 1, wherein performing said etching process removes substantially all of said doped region.

12. The method of claim 1, wherein said initial nanowire structure has a cross-sectional configuration that is substantially circular.

13. The method of claim 1, wherein said initial nanowire structure and said final nanowire structure have cross-sectional configurations that are substantially the same.

14. A method of forming a device, comprising:
    forming an initial nanowire structure having an initial cross-sectional size;
    performing a doping diffusion process to form an N-type doped region in said initial nanowire structure, wherein said doping diffusion process is performed at a temperature that falls within the range of about 600-1100° C. and wherein said doped region has a dopant concentration of N-type dopant material that falls within the range of about $10^{19}$-$10^{21}$ atoms/cm$^3$; and
    performing an etching process to remove at least a portion of said doped region and thereby define a final nanowire structure having a final cross-sectional size, wherein said final cross-sectional size is smaller than said initial cross-sectional size.

15. The method of claim 14, further comprising forming a gate structure around at least a portion of said final nanowire structure.

16. The method of claim 14, wherein performing said doping diffusion process comprises performing one of a plasma doping process or a gas phase doping process.

17. The method of claim 14, further comprising, after performing said doping process, performing a dopant drive-in heat treatment process.

18. The method of claim 14, wherein performing said etching process comprises performing a chlorine-based etching process.

19. The method of claim 14, wherein said final cross-sectional size is about 20-80% smaller than said initial cross-sectional size.

20. The method of claim 14, wherein performing said etching process removes substantially all of said doped region.

21. The method of claim 14, wherein said initial nanowire structure has a cross-sectional configuration that is substantially circular.

22. The method of claim 14, wherein said initial nanowire structure and said final nanowire structure have cross-sectional configurations that are substantially the same.

23. A method of forming a device, comprising:
    forming an initial nanowire structure having an initial cross-sectional size;
    performing a doping diffusion process to form an N-type doped region in said initial nanowire structure, wherein said doping diffusion process is performed at a temperature that falls within the range of about 600-1100° C. and wherein said doped region has a dopant concentration of N-type dopant material that falls within the range of about $10^{19}$-$10^{21}$ atoms/cm$^3$; and
    performing a chlorine-based etching process to remove at least a portion of said doped region and thereby define a final nanowire structure having a final cross-sectional size, wherein said final cross-sectional size is about 20-80% smaller than said initial cross-sectional size.

24. The method of claim 23, further comprising forming a gate structure around at least a portion of said final nanowire structure.

25. The method of claim 23, wherein performing said doping diffusion process comprises performing one of a plasma doping process or a gas phase doping process.

26. The method of claim 23, further comprising, after performing said doping process, performing a dopant drive-in heat treatment process.

27. The method of claim 23, wherein performing said etching process removes substantially all of said doped region.

28. The method of claim 23, wherein said initial nanowire structure has a cross-sectional configuration that is substantially circular.

29. The method of claim 23, wherein said initial nanowire structure and said final nanowire structure have cross-sectional configurations that are substantially the same.

* * * * *